United States Patent
Livingston et al.

(12)

(10) Patent No.: US 6,783,920 B2
(45) Date of Patent: Aug. 31, 2004

(54) PHOTOSENSITIVE GLASS VARIABLE LASER EXPOSURE PATTERNING METHOD

(75) Inventors: Frank E. Livingston, Hermosa Beach, CA (US); Henry Helvajian, Pasadena, CA (US)

(73) Assignee: The Aerospace Corporation, El Segundo, CA (US)

( * ) Notice: Subject to any disclaimer, the term of this patent is extended or adjusted under 35 U.S.C. 154(b) by 79 days.

(21) Appl. No.: 10/345,012

(22) Filed: Jan. 15, 2003

(65) Prior Publication Data

US 2004/0137372 A1 Jul. 15, 2004

(51) Int. Cl.$^7$ .............................. G03C 5/00; G02B 6/00
(52) U.S. Cl. ....................... 430/322; 430/323; 430/945; 430/330; 428/410; 428/913; 501/11; 501/53; 216/80
(58) Field of Search ................................. 430/322, 323, 430/945, 330; 428/410, 913; 501/11, 53; 216/80

(56) References Cited

U.S. PATENT DOCUMENTS 5,628,926 A * 5/1997 Belgacem et al. ..... 219/121.71
6,678,453 B2 * 1/2004 Bellman et al. ............ 385/129

* cited by examiner

Primary Examiner—John A. McPherson
Assistant Examiner—Daborah Chacko-Davis
(74) Attorney, Agent, or Firm—Derrick Michael Reid

(57) ABSTRACT

The direct-write pulsed UV laser technique combined with the variable laser exposure fabrication method entails the precise variation of the laser irradiance during pattern formation in the photostructurable glass for variable laser exposing processing. The variable laser exposure patterning utilizes the dependence of the chemical etching rate on the controlled laser exposure dose for forming variable laser irradiated and crystallized regions of the exposed glass, that have variable etch rates that are dependent on the laser irradiance, resulting in the formation of high and low aspect ratio features in a common substrate that are realized during a single, maskless etch step.

7 Claims, 4 Drawing Sheets

PHOTOSENSITIVE GLASS PATTERNING PROCESS

PATTERNED VARIABLE LASER EXPOSURE

HIGH AND LOW ASPECT RATIO FEATURES

ETCH RATE FOR PHOTOSENSITIVE GLASS

PHOTOSENSITIVE GLASS VARIABLE LASER EXPOSURE PATTERNING METHOD

REFERENCE TO RELATED APPLICATION

The present application is related to applicant's copending application entitled Ultraviolet Method of Embedding Structures in Photocerams, Ser. No. 09/821,918 and filed Mar. 30, 2001, by a common inventor and by the same assignee.

STATEMENT OF GOVERNMENT INTEREST

The invention was made with Government support under contract No. F04701-00-C-0009 by the Department of the Air Force. The Government has certain rights in the invention.

FIELD OF THE INVENTION

The invention relates to the field of microfabrication of glass ceramic materials. More particularly, the present invention relates to the manufacture of structure within photoactivable glasses and ceramics using variable laser exposures.

BACKGROUND OF THE INVENTION

Glass is a highly versatile and functional-material that can be designed with specific properties, such as high compressive strength and durability, corrosion resistance and chemical inertness, low thermal and electrical conductivity, negligible porosity and biocompatibility. Consequently, glass has received significant attention for potential applications in a variety of scientific and industrial fields, including aerospace engineering, photonics, optoelectronics, biology and biochemistry, and microelectromechanical systems (MEMS) design. These applications require integrated and functional structures that range in scale from the microscale of less than 100 $\mu$m, to the mesoscale of 100 $\mu$m to 10 mm, and to the macroscale of greater than 10 mm. For example, integrated photonic and biofluidic devices have feature dimensions varying from submicrons to the hundreds of microns. In the intermediate mesoscale domain, arrays of glass microfluidic channels and precision volume containers, such as microtiter plates, are often utilized to facilitate the automation of chemical and biochemical analysis.

The ability to fabricate intricate microstructures in glass materials is essential to meet the increasing demands of future microtechnology development. These advanced design requirements will involve the fabrication of high and low aspect ratio structures with variegated heights on a common substrate. Microscale and mesoscale structure fabrication in glass materials have typically been achieved using optical lithographic patterning and chemical etching, mechanical micromilling and direct thermal ablation with ultrafast lasers. Although lithography and mechanical cutting methods permit the formation of two dimensional patterns, these approaches do not allow the fabrication of true three dimensional structures with high and low aspect ratios.

In principle, conventional material removal methods can be applied to the cofabrication of two-dimensional microstructures with different aspect ratios on a shared substrate. However, the processing steps are numerous and costly for these approaches to be practical and economical. For microelectromechanical systems applications requiring concurrent and proximal high aspect ratio and low aspect ratio features, the fabrication solution generally involves the use of an elaborate masking sequence. The sequential masking steps are intended to protect physically the low aspect ratio structures during the long duration etching time needed to form the high aspect ratio structures. An alternative approach concerns the introduction of dopants and impurities into the substrate that selectively alter the local etching rate and permit the concurrent formation of high and low aspect ratio features. Another alternative is to generate the high and low aspect ratio structures on separate substrates. Following preparation, the substrates can be joined or packaged together to merge the variegated aspect ratio structures. Unfortunately, these alternative solutions are time consuming, difficult and expensive to implement. Laser ablation or micromilling methods can fabricate continuously variable aspect ratio structures in glass or ceramic materials. However, the fabricated structures suffer from residual thermal induced effects, such as structural stress, cracks and optical defects.

A prior method demonstrated in the related application teaches fabricating embedded structures in glass and ceramic materials that are photostructurable glass ceramic material, commonly called pyrocerams or photocerams. One photostructurable material has been commercially available under the tradename Foturan™. This photostructurable material is a preferred photoceramic material, but other glass ceramic materials are also suitable for photostructuring of embedded structures using laser exposure. A predetermined laser energy dose and wavelength are applied to the Foturan photoceramic material. The laser is a pulsed ultraviolet laser. The laser provides a pulsed laser beam using a lens defining a beam waist at a focal depth that is moved during exposure relative to the exposed material. The choice of the UV wavelength is critical. The wavelength is preferably at the very edge of the spectral region where photoceram transitions from being strongly absorbing to weakly absorbing. In the weakly absorbing spectral region, the wavelength of the laser is outside the strong absorption band of the photoceramic material. Hence, the absorption of radiation is very small so that the process is photon inefficient but enables the controlled focused exposure of any volume including an embedded focal volume defining an embedded three-dimensional structure. The focused beam illuminates the material with the intensity peaking in the focal volume. The number of pulses and pulse fluence controls the amount of the exposure dose so that the exposure outside the focal depth, that is, outside the depth of the optical field in a collateral volume, is insufficient for conversion of the material to the soluble crystalline phase. Within the depth of focus region, that is, the focal volume, the combined effect of the focused laser beam fluence in Joules/cm$^2$, and the dose in terms of the number of laser pulses is beyond a critical dose that is required for conversion to the crystalline phase. The focused pulsed ultraviolet laser and a computer-controlled sample positioning stage and shutter provides motion controls for moving the material relative to the focus laser beam during selective exposure of the focal volume. True three-dimensional patterns can be formed by moving the sample using an XYZ positioning stage in XYZ directions. Motion and shutter operations are both computer controlled. For example, laterally moving the workpiece in the XY plane can create an embedded tunnel within the material, while moving vertically for adding via openings to the end sections of a tunnel so as to undercut the structure above leaving an anchored but suspended structure. The result is an embedded microstructure or an exposed pixel defined in the focal volume.

The method can be used to create one or more stacked embedded structures. There is no critical exposure above and below depth of focus. The material is only critically exposed in the focal volume region where the administered laser dose is above a critical dose. Repeated exposures at different depth of focus enable the formation of stacked embedded structures. Precise structural definition is realized for creating one or more embedded structures because collateral volume regions above and below the focal volume at the depth of focus do not accumulate the critical exposure dose. The critical dose is based on sufficient per pulse fluence that is the energy per unit area in a single pulse and the number of pulses. For a given laser pulse width and wavelength, the per pulse fluence is proportional to irradiance. The exposure process is a nonlinear optical process, that is, the critical dose is a nonlinear function of the per pulse laser fluence. That is, the critical dose required for conversion to the crystalline phase is both a function of the per pulse fluence and the number of applied pulses. The dose dependence is nonlinear in per pulse fluence and is cumulative. The most intense portion of the focused pulsed laser light is sufficient to deliver the critical dose over a predetermined number of pulses. Exploiting the nonlinear aspect of the exposure process allows for creation of stacked structures at any desired focal depth. The wavelength is in the weak absorption region so that a critical dose is not delivered to the collateral volume where the pulsed laser light is not focused and not as intense as in laser focal volume where the laser light provides a critical dose. Hence, the pulsed laser light has a wavelength in the weak absorption region of the photoceram so that the pulsed laser light passes through the collateral volume without delivering a critical dose and without producing crystallization outside the focal depth. The pulsed laser light is focused and intensely converges for accumulation of the critical dose only in the focal volume for selective critical dose exposure at the focal depth in the photoceram enabling precise embedded volumetric critical dose exposure. Exposing the photoceram material with higher fluence focused light provides a sharp selective contrast between the insufficiently exposed collateral volume and the sufficiently exposed focal volume. During fabrication, the method provides a trade off between laser fluence and the number of applied pulses. The critical dose of pulsed UV light provides an embedded growth of an etchable crystalline phase of the photoceram. By exposing bulk photoceram material to a fluence gradient for a variety of pulse train lengths, and by measuring the dimensions of the etched region, the proper critical dose can be determined in terms of wavelength, intensity and the number of pulses.

A crystallization boundary is created in the photostructurable glass where the critical dose is and is not exceeded. Above the critical dose, the photostructurable glass is crystallized for forming a latent image in the focal volume. Below the critical dose, no image is formed, and hence, no crystallization occurs in that region of the photostructurable glass. The crystallization boundary separates the collateral volume from the focal volume. The crystallized glass that was subjected to a dose higher than critical dose in the focal volume is etched away from the collateral volume of photostructurable material. The under-exposed, uncrystallized photostructurable glass in the collateral volume that did not have a critical exposure remains after etching. The critical dose is required to create a density of nuclei large enough to result in an interconnected network of crystallites. The crystallites are etched away in a subsequent etching process. The density of nucleation sites is proportional to the dose and the critical dose will be a function of the material composition and process parameters. For a given number of pulses, the critical dose will correspond to a critical fluence. When a focal volume of embedded photoceram material is exposed above the critical dose, the focal volume can then be developed, etched, and vacated, the vacant cavity defining the embedded structure.

This prior method enables the formation of embedded microstructures, microcavities in a particular class of glass and ceramic materials. The method also enables the patterned undercutting of unexposed structures resulting in the fabrication of suspended or supported glass and ceramic microstructures. A micromachining station includes a pulsed laser that provides a focused laser beam and the workpiece including the photoceram material. The laser can be moved relative to a stationary workpiece, or equivalently, the workpiece can be moved relative to the laser beam, both according to a predefined computer program. The exposure process is maskless and amenable to rapid batch fabrication of the embedded structures because the only serial aspect of the process is the exposure step. A parallel batch fabrication process can be used in the actual material removal step. Depth control of the laser light is achieved by the proper choice of exposure wavelength and focusing optics. As the laser wavelength is tuned into the weak absorption end of the UV absorption band of the photoceram material, the absorption of laser light decreases in the collateral volume and the penetration depth increases into the focal volume for crystallization of embedded structures. The pulsed laser ultraviolet light beam can be shaped resulting in structures that will retain the beam shape. For example, a collimated beam can result in a cylindrical hole. A focused beam can result in either a cone section, or a hyperboloid structure.

The prior method is a direct-write three dimensional (3D) volumetric lithography method for selective removal of the embedded photoceram material. The method is photon efficient in the sense that the laser must only provide the energy to form a latent image. The method does not need to provide the energy to break atomic bonds and remove unwanted material from the workpiece. Direct write tools, such as computer-aided manufacturing programs and fixtures coupled to a pulsed ultraviolet laser are used in a micromachining station for rapid batch processing and enhanced depth control. The pattern exposure and dissolving steps can be done across an entire wafer for batch processing. The prior method achieved the intended purpose, of defining a critical dose, for the creation of an embedded structure. However, the method relies upon flood illumination at a maximum intensity for rapid critical dose exposure for forming exposed volumes having a single etch rate with the exposed volumes then being etched using traditional multiple photomasking steps for creating respective differing aspect ratio features. The prior method does not enable cost effective etching and variable aspect ratio processing of photosensitive materials. These and other disadvantages are solved or reduced using the new invention.

SUMMARY OF THE INVENTION

An object of the invention is to provide a method for forming high and low aspect ratio features in a photosensitive material.

Another object of the invention is to provide a method for forming high and low aspect ratio features in a photosensitive material through variable laser intensity exposure without the need for employing protective masks.

Yet another object of the invention is to provide a method for forming high and low aspect ratio features in a photosensitive material through variable laser intensity exposure resulting in differing etch rates of respective volumes of the photosensitive material without the need for employing protective etch masks.

Still another object of the invention is to provide a method for forming high and low aspect ratio features in a photosensitive material during a single etch process step through variable laser intensity exposure of the photosensitive material resulting in differing etch rates of respective volumes of the photosensitive material.

The invention is directed to a material processing technique that permits the sequential volumetric patterning of variegated and high and low aspect ratio structures on a common glass substrate. A complete ensemble of patterned structures can be simultaneously released using a single, timed-interval etching technique. The variable laser exposure method offers direct-write serial patterning with batch chemical processing, and permits the fabrication of complex structures and features on a single wafer. Precise variation of the laser irradiance is used during material patterning. The controlled variation of the laser irradiance is used to selectively alter the chemical etch rate of the processed regions in the glass so that high and low aspect ratio features can be formed using a single chemical etch step. The method is preferably applied to photoceramic or photosensitive glass for fabricating continuously variable aspect ratio structures on a common substrate. The required relief structures can be realized without using any masking layers for cost effective batch fabrication. Adjacent microstructures with aspect ratios of 2:1 to 30:1 can be laser patterned through variable exposure processing and concurrently fabricated on a shared single glass wafer following a single chemical etch step. The variable exposure method enables the conversion of computer assisted design patterns and corresponding laser irradiance information into realized microfabricated structures in glass or ceramic form that retain precise feature sizes within desired, predetermined dimensions. The variable laser method offers precision glass or ceramic material pattering of mesoscale devices that contain microscale features with variable aspect ratios. For example, the method can be used to fabricate various millimeter-sized components that may be useful in far infrared or terahertz devices that require high aspect ratio mesoscale structures with microscale features. These and other advantages will become more apparent from the following detailed description of the preferred embodiment.

DETAILED DESCRIPTION OF THE PREFERRED EMBODIMENT

Figure 1:
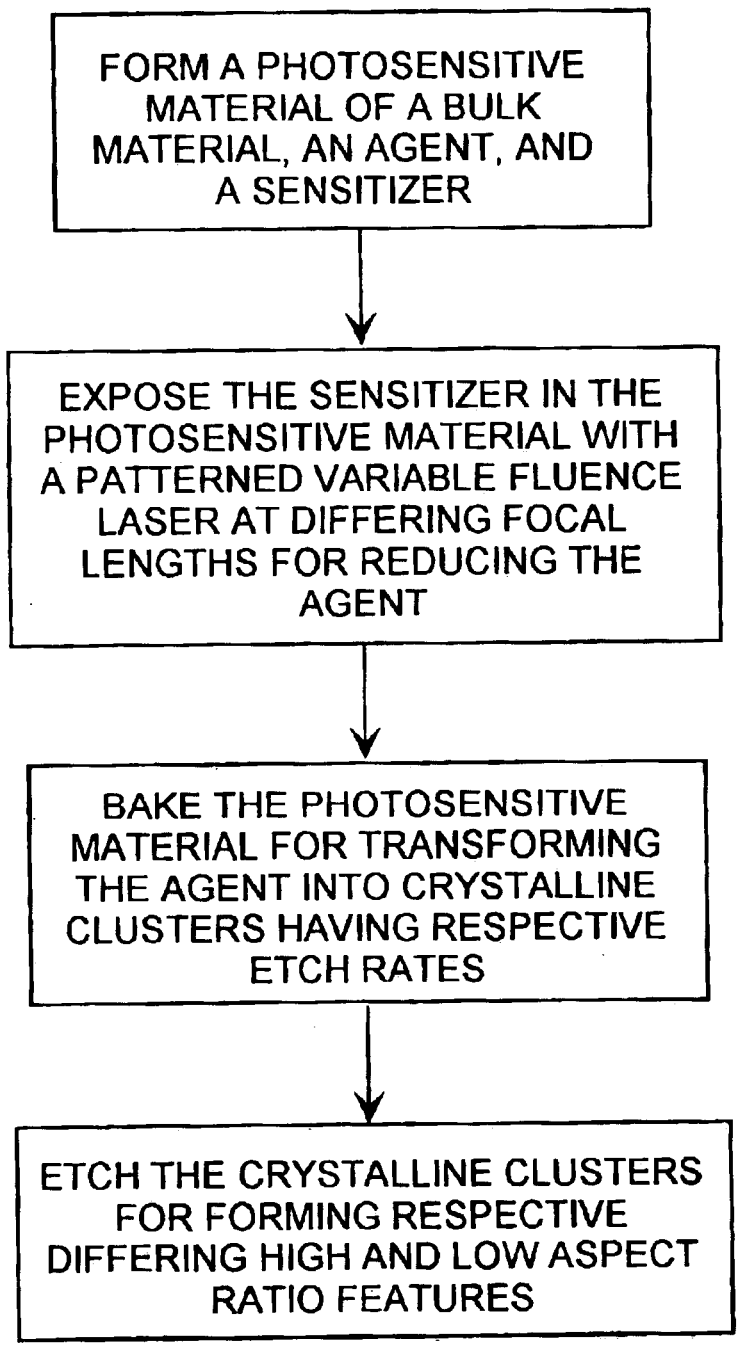
FIG. 1 is a photosensitive glass patterning process flow diagram.

An embodiment of the invention is described with reference to the figures using reference designations as shown in the figures. Referring to FIG. 1, the method starts with forming a photosensitive, that is, a photostructurable material. Photostructurable materials are commercially available. The photostructurable material would include a bulk material along with a nucleating agent and a sensitizer. In the preferred form, the bulk material is an alkali-doped glass, the nucleating agent is silver, and the sensitizer is cerium. The method can be applied to the class of amorphous glass ceramic materials that are directly photostructurable. The photostructurable glass ceramic can be an amorphous alkali-aluminosilicate glass obtained from Schott Corporation under the trade name Foturan™. The photosensitive properties result from trace dopants that enable the formation of an exposed latent image in the glass. Photoactivation typically occurs at ultraviolet (UV) wavelengths of less than $\lambda=350$ nm where the glass material is strongly absorbing.

The photosensitive material is then exposed to a variable intensity laser beam that is preferably a pulsed laser beam. The laser is focused to an XYZ focal point within the bulk material at a predetermined exposure intensity I. The laser beam is focused at differing focal lengths for exposing the material at varying depths for each XYZ focal point using a series of accumulated pulses of the pulsed laser beam. The intensity is predetermined for each XYZ point to be exposed so that the intensity I varies from point to point as the focal point is stepped from point to point for providing a time variable exposure over time $I(t,X,Y,Z)$. In the preferred form, the laser beam has a wavelength of $\lambda=355$ nm, and is pulsed at 10.0 kHz. The time-stepped variable laser exposures can be implemented as an exposure sequence using coded, preprogrammed exposure burn scripts for computerized stepped exposures of the material during single patterning step for providing variable intensity exposure throughout the bulk material. The microscale and mesoscale features can be realized using a single color exposure, for example, at $\lambda=355$ nm, where the absorption is small and the optical penetration depth is several millimeters. This large penetration depth allows the laser exposure dose to be precisely controlled over dimensions ranging from a few micrometers to several millimeters to achieve shallow surface channels as well as deep trenches, embedded channels, with high and low aspect ratio features.

After variable laser patterning, the exposed irradiated sample is then baked to transform the latent image into a visible permanent image. Subsequently, material removal and structure fabrication are performed by preferential isotropic chemical etching of the developed, highly crystalline regions of the bulk material. The material can be further laser processed and thermally treated to create a ceramic structure with high fidelity of the etched features. The baked sample is then etched in a single etching step. That is, the total pattern ensemble of various aspect ratio features of the exposed bulk material can be chemically etched in a single chemical etching step. The single chemical etching step of the variable laser exposure method facilitates rapid prototype processing and patterning with component uniformity. During chemical etching, areas of low irradiance exposure are etched at a low rate and areas of high irradiance exposure are etched at a higher rate, so that both high and low aspect ratio features are concurrently etched during the same chemical etch step so that low and high aspect ratio features are concurrently formed during the this single chemical etching step. This single-step batch chemical etching promotes large area material processing at low cost.

Figure 2A:
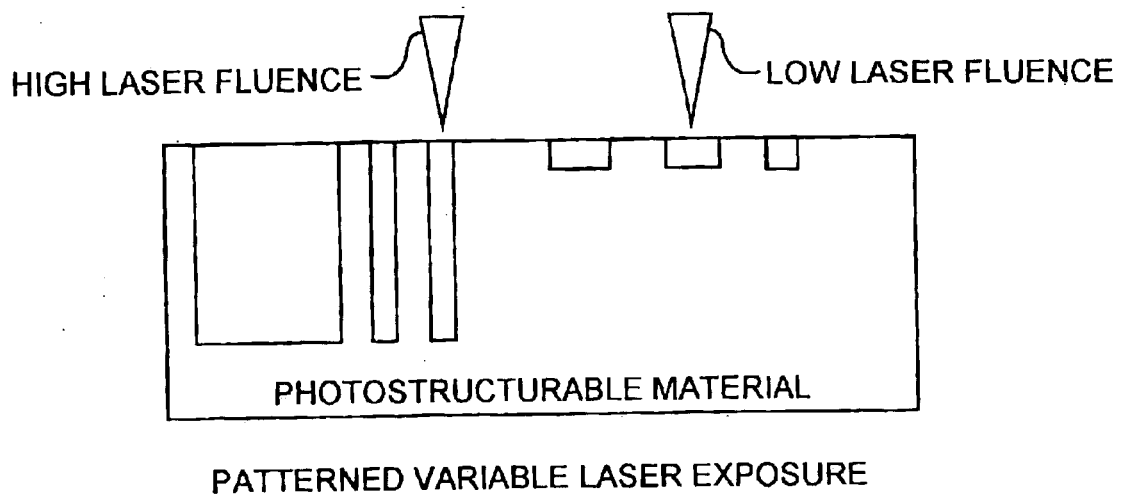
FIG. 2A is a cofabrication drawing of desired high and low aspect ratio structures to be formed in a common substrate using respective high fluence and low fluence laser exposure.
Figure 2B:
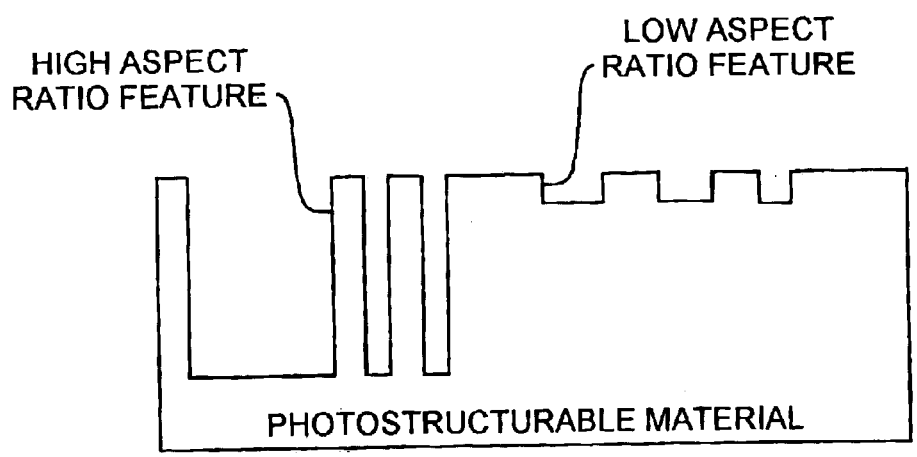
FIG. 2B is a cofabrication drawing of resulting high and low aspect ratio structures formed in a common substrate.

Referring to FIGS. 1, 2A, and 2B, and particularly to FIGS. 2A and 2B, the variable exposure patterning method can be used to form many different aspect ratio features of an etched device using a single etching time-stepped sequence. The crosscut views of a typical layout shows structures with low aspect ratio of less than 3:1 that are cofabricated next to high aspect ratio features of greater than 10:1. High intensity laser fluence is used to expose the bulk material for creating high aspect ratio features at predetermined deep XYZ points, and low intensity laser fluence is used to expose the bulk material for creating low aspect ratio features at other predetermined XYZ shallow points. Each point can be exposed at a respective intensity level and depth. Because both the high and low fluence exposures occur during the preprogramed time-stepped sequence, both high and low aspect feature exposure effectively occur during a single burn sequence.

Figure 3A:
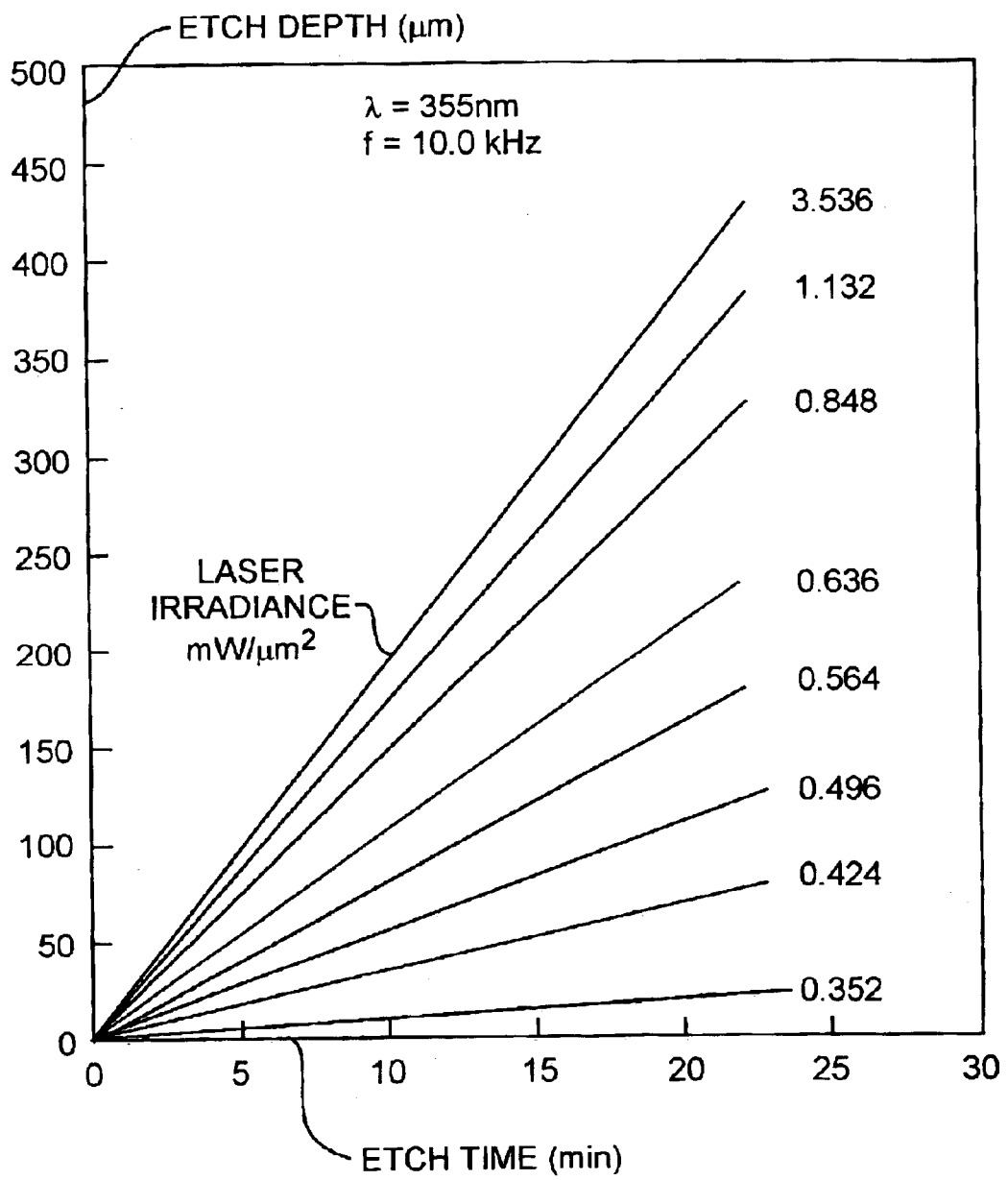
FIG. 3A is a graph showing the etch depth versus etch time for exposed and processed photostructurable glass at various incident laser irradiances.

Referring to all of the Figures, and more particularly to FIG. 3A, an element of the laser processing method is the dependence of the chemical etching rate on the incident pulsed UV laser irradiance. Experimental data shows a linear dependence of the chemical etch depth over etch time on the intensity of the pulsed UV laser irradiance. The chemical etching rate ratio is defined as the etching rate of the exposed crystallized material divided by the nascent etching rate of the unexposed amorphous material. The native etch rate of the unexposed material has been determined to be $0.62 \pm 0.06$ $\mu$m/min. The etch rate linear curves correspond to incident laser irradiances that ranged from 0.35 mW/$\mu$m$^2$ to 3.53 mW/$\mu$m$^2$. The etch depth versus etch time for exposed and processed Foturan at various selected incident laser irradiances reveals a linear function.

Figure 3B:
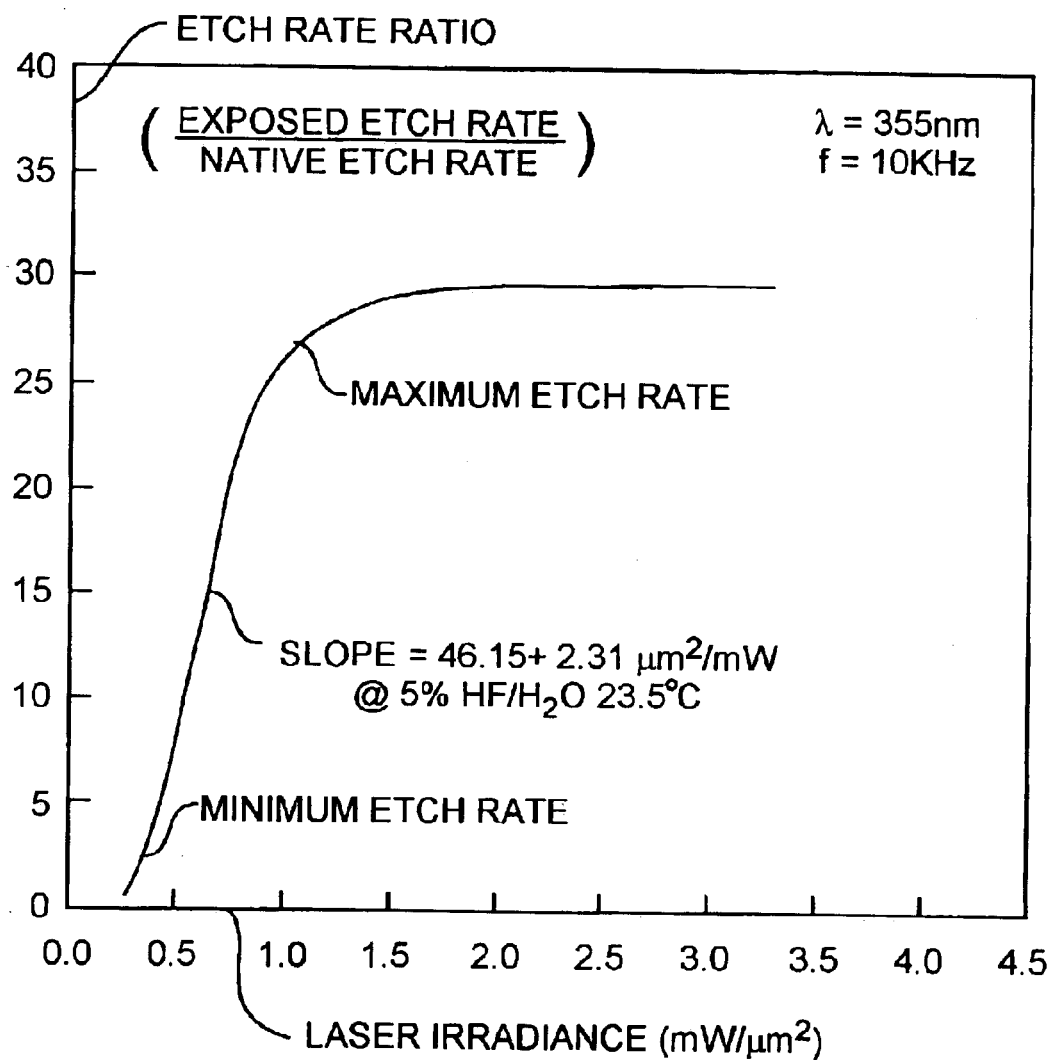
FIG. 3B is a graph showing the etch rate ratio versus laser irradiance for a photosensitive glass.

Referring to all of the Figures, and more particularly to FIG. 3B, an etch rate ratio is defined as the exposed etch rate divided by the native etch rate. The method relies on the dependence of the chemical etching rate on the laser irradiance and the application of this dependence to the fabrication of variable aspect ratio microstructures. The etch rate ratio depends on the specific material processing conditions, the heat treatment, and the chemical etching procedures. The etch rate ratio is shown as a function of the laser irradiance for Foturan at $\lambda$=355 nm with a laser pulse frequency of 10.0 kHz. Discovery is made that the etch rate ratio of the exposed etch rate over the native etch rate is a nonlinear curve having a linear region with a predetermined constant slope between a minimum etch rate and a maximum etch rate. Within this linear region, the etch rate ratio is directly and linearly dependent on the laser irradiance level between the minimum and maximum etch rates. The etch rate of the photostructurable glass is based on linear functional dependence of the laser irradiance. Preferably, the variable laser intensities is varied during the time-stepped exposure sequence between the maximum and minimum etch rate, and more particularly within the linear region. It is this linear functional dependence that enables cost effective UV laser direct-write patterning for concurrently fabricating microscale and mesoscale structures on a common substrate during a single exposure sequence using variable intensity levels within the linear region. With controlled variable laser levels, structures can be formed in close proximity to each other, and retain variegated heights with high and low aspect ratios. The implementation of this functional dependence is only made possible by using conventional solid-state UV lasers that have the preferred long term power stability and high mode quality.

The method directly relies upon varying the intensity exposure level when focusing the laser beam at different XYZ points within the bulk material. Conventional bulk material processes can be used to form the bulk material, and conventional baking and single mask chemical etching to process an exposed sample of the bulk material. However, the variable intensity exposure can be realized using a variety of apparatus and work stations. In a best mode of carrying out the variable intensity exposure step, a work station, not shown, can be designed to provide the preferred time-stepped variable exposure sequence. For example, a conventional stable Nd:YVO$_4$ laser is used to provide a $\lambda$=355 nm pulsed laser beam that is pulsed at 10.0 kHz. This laser may also provide other wavelengths laser beams, such as a $\lambda$=532 nm laser beam, that can be utilized to monitor the stability of the laser. The $\lambda$=355 nm pulsed laser beam is passed through a circular neutral density filter. The circular neutral density filter is a UV-compatible filter that receives a constant power laser beam and then provides a variable intensity laser beam as a function of angular orientation of the circular filter. A shutter can be used to block the laser beam, such as during black out times when transiting a focal point of the variable laser beam the between differing XYZ points within the bulk material. Significantly, the laser power can be easily varied using a conventional circular neutral density filter that can be coupled to an angular micropositioning motor that is, in turn, controlled by a processing computer, that can also control shutter operations. Resulting variable laser intensity can be measured using surface absorbing disk calorimeters for monitoring the operation of the circular neutral density filter and to monitor desired intensity exposure levels. The measured laser intensity values for laser intensity monitoring can be fed into the controlling computer for monitoring and controlling the angular position of the circular neutral density filter for accurate closed-loop control of the variable intensity levels at any time during the time-stepped sequence.

The laser beam is then focused on or within the glass substrate surface using, for example, a UV-transparent achromatic 10x microscope, such as an LMU-10x-248 microscope. The effective focal length of the microscope can be 20.0 mm at a $\lambda$=355 nm wavelength. The laser spot diameter, for example, may be 3.0 $\mu$m and the confocal parameter at 1.0 mm. The glass sample is positioned on a 10.0 cm diameter vacuum chuck coupled to a micro-position stepper motor, and aligned in situ, using a non-contact, white-light optical profiler, such as an NT-2000, equipped with a interferometric microscope and piezoelectric transducer. The glass wafers can be aligned to a flatness corresponding to half visible wavelength accuracy over 100 mm. The controlling computer can then execute the burn sequence, by stepping the bulk material under lateral X, traversal Y, and vertical Z directions under stepper motion control to place the focal point of the laser beam at differing XYZ points within the bulk material, while currently, under angular motion control of the circular neutral density filter, varying the exposure intensity at the respective exposed XYZ points, between which points, using shutter control to block out the laser beam so as to black out the exposure of the material. As such, the controlling computer can execute a preprogrammed burn script for perfecting the time-stepped variable intensity exposure sequence that is fast, accurate, and automatically computer-controlled.

Many different devices having differing aspect ratio features can be made in a single device, such as a waveguide mixer block designed for terahertz frequencies with features with heights that range from 50–100 $\mu$m and depths that range from 100–400 $\mu$m, with a feedhorn having ridges that are 100 $\mu$m in width and 200 $\mu$m in height and are located at a depth of 600 $\mu$m. The variable laser exposure processing technique permits the fabrication of these small 2:1 aspect ratio ridges in a region of large area material removal. The method can be used, for another example, to make a tiered diffractive element. The diffractive element can contain terraces that are 300 μm in width and steps that are 100 μm in height. A flagpole type feature can be made, for another example, being 600 μm in height and 30 μm in diameter with an aspect ratio of 20:1. The experimental data has shown that it is possible to fabricate microstructures with aspect ratios exceeding 30:1, with aspect ratio of less than 20:1 being accurately and routinely achieved using the variable exposure method.

The unique combination of direct-write volumetric laser patterning and variable exposure techniques provides a powerful analytical tool for creating true three-dimensional microscale and mesoscale structures with varying heights and aspect ratios. These structures can be created on a common substrate using a single timed-stepped etching method. This variable laser exposure method can have broad interdisciplinary applications to the processing and structuring of photosensitive materials. The variable exposure method can also employ other laser wavelengths to achieve the desired penetration depths and feature sizes.

The method preferably uses solid-state ultraviolet lasers to fabricate structures in glass or ceramic materials. The method can enhance the value of devices fabricated on glass substrates by permitting the micropatterning of complex relief structures over areas ranging from coupon or mm$^2$ die sizes to architectural glass m$^2$ sizes. For example, the method can be applied to microscale and mesoscale biofluidic devices and chemical sensing instruments and in terahertz to millimeterwave communication and imaging systems. The preferred form of the invention can be modified in terms of pulse widths, intensity, and wavelengths and be used on a variety of photosensitive materials. Those skilled in the art can make enhancements, improvements, and modifications to the invention, and these enhancements, improvements, and modifications may nonetheless fall within the spirit and scope of the following claims.

What is claimed is:

1. A method for forming differing aspect ratio features in a photostructurable material comprising a bulk material, a nucleating agent and a sensitizer, the method comprising the steps of, exposing an XYZ point within the photostructurable material at a respective intensity level at a focal point of a laser beam, repeating the exposing step for a plurality of XYZ points within the photostructurable material at a respective plurality of intensity levels, the respective plurality of intensity levels providing a variable intensity exposure of the photostructurable material, the photostructurable material having a plurality of etch rates depending on the respective plurality of intensity levels, baking the photostructurable material for transforming the nucleating agent into crystalline structures with differing etch rates that depend on the respective plurality of intensity levels, and etching the photostructurable material for etching the crystalline clusters for forming differing aspect ratio features.

2. The method of claim 1 wherein, the bulk material is an alkali-doped glass the nucleating agent is silver, and the sensitizer is cerium.

3. The method of claim 1 wherein, the laser beam is a pulsed UV laser beam.

4. The method of claim 1 wherein, the laser beam is a λ=355 nm 10 kHz pulsed laser beam.

5. The method of claim 1 wherein, the etching step is a maskless etching step.

6. The method of claim 1 wherein, the differing etch rates are linearly dependent on the respective plurality of intensity levels.

7. The method of claim 1 wherein, a first XYZ point of the XYZ points at a first Z depth is exposed at a first focal depth at a first intensity level of the plurality of intensity levels, a second XYZ point of the XYZ points at a second Z depth is exposed at a second focal depth at a second intensity level of the plurality of intensity levels, the first Z depth is less than the second Z depth, and the first intensity level is higher than the second intensity level.

* * * * *